(12) United States Patent
Vaiana et al.

(10) Patent No.: US 7,489,196 B2
(45) Date of Patent: Feb. 10, 2009

(54) OUTPUT POWER CONTROL OF AN RF AMPLIFIER

(75) Inventors: Michele Vaiana, Paternò (IT); Giuseppe Gramegna, Catania (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/747,539

(22) Filed: May 11, 2007

(65) Prior Publication Data

US 2007/0273448 A1 Nov. 29, 2007

(30) Foreign Application Priority Data

May 12, 2006 (EP) ................ 06425321.4

(51) Int. Cl.
*H03G 3/30* (2006.01)
(52) U.S. Cl. .............. 330/285; 330/289; 330/296
(58) Field of Classification Search .......... 330/285, 330/288, 289, 296
See application file for complete search history.

(56) References Cited

U.S. PATENT DOCUMENTS

| 6,271,695 | B1 | 8/2001 | Gramegna et al. ...... 327/110 |
| 6,304,108 | B1 | 10/2001 | Inn ...................... 327/72 |
| 7,271,656 | B2 * | 9/2007 | Joly et al. ............ 330/285 |
| 2002/0024390 | A1 | 2/2002 | Yamashita et al. ...... 330/298 |
| 2004/0056721 | A1 | 3/2004 | LeSage et al. .......... 330/289 |
| 2005/0068107 | A1 | 3/2005 | Bachhuber et al. ...... 330/285 |

FOREIGN PATENT DOCUMENTS

| EP | 0609053 | 8/1994 |
| EP | 0942524 | 9/1999 |
| EP | 1326328 | 7/2003 |

OTHER PUBLICATIONS

Jarvinen et al., Bias Circuits for GaAs HBT Power Amplifiers, Microwave Symposium Digest, 2001 IEEE, MIT-S International, vol. 1, May 20, 2001, pp. 507-510.

* cited by examiner

*Primary Examiner*—Khanh V Nguyen
(74) *Attorney, Agent, or Firm*—Lisa K. Jorgenson; Allen, Dyer, Doppelt, Milbrath & Gilchrist, P.A.

(57) ABSTRACT

Precision and reliability of a current limited mode output power control of an RF amplifier is enhanced by sensing the base current of the current controlled output power transistor. The base current is compared to a control current that is normalized by scaling it as a function of the current gain of a bipolar junction transistor of similar characteristics as the output power transistor. Fabrication process spread of current gain figures of bipolar junction transistors is effectively compensated. Moreover, by using a band-gap temperature compensation control current that is eventually β-scaled before comparing it with the sensed base current of the output power transistor, the output power may be effectively controlled and maintained constant over temperature as well as process spread variations.

17 Claims, 5 Drawing Sheets

OUTPUT POWER CONTROL OF AN RF AMPLIFIER

FIELD OF THE INVENTION

The present invention relates to sensing and control of an output power signal from an electronic amplifier, and in particular, a radio frequency (RF) power amplifier.

BACKGROUND OF THE INVENTION

The demand for power amplifiers for wireless handsets is growing at a rapid rate. Communication standards such as GSM, EDGE and DCS require precise output power control of the power amplifier (PA). Generally, a current controlled bipolar transistor is used, such as a BJT or an HBT, to improve signal to noise ratio of receiver channels. At the same time, talk time and battery life are increased by reducing power consumption of the transmitter.

Moreover, overall system efficiency of a GSM/EDGE transmitter can be increased using polar architectures [1]. In this case, bias circuits to control the PA output power, with large dynamic range and no degradation on efficiency and linearity, need to be designed to comply with system specifications.

A voltage limited mode will now be discussed. The output power of a high efficiency PA can be expressed in terms of the supply voltage Vcc as:

$$P_{OUT} = k_V \cdot \frac{(V_{CC} - V_{CESAT})^2}{R_{LOAD}} \quad \text{Equation 1}$$

Where Rload represents the load resistance and $k_v$ is a scale factor function of the class of operation of the power amplifier. Thus, as well as in AM modulators [2], a linear dB regulation of the output power can be obtained by varying the supply voltage Vcc using a linear voltage regulator [3] to control the PA output power. A simplified implementation of this approach is depicted in FIG. 1.

At low power levels, when Vcc approaches $V_{CESAT}$, accuracy of the power control is limited due to the inability to compensate $V_{CESAT}$ and non-linear effects of temperature variations. Power dynamic range is then limited between the maximum supply voltage, usually fixed by the application and the power device ruggedness, and a minimum supply voltage that is close to $V_{CESAT}$ of the power transistor.

An extended high accuracy range can be obtained if a power control feedback is introduced between the PA and the voltage regulator to compensate output power variation due to temperature changes. In this case, a directional coupler and power detectors can be used to close the feedback loop with the drawbacks of an increased insertion loss along the transmit channel and a cost increase of the device because of the additional silicon area required. Moreover, stability of the closed-loop needs to be ensured at every power level and load condition.

A current limited mode will now be discussed. It is well known that in high efficiency power amplifiers, the output power is a function of collector current of the bipolar power device when functioning in a discontinuous conduction mode. Thus, an enhanced output power dynamic range and accuracy of control can be obtained by sensing and limiting the output current of the PA.

In this case, the amplifier operating mode becomes a current-limited operation mode in which Equation 1 no longer holds and Pout is given by the following equation:

$$P_{out} = k_C \cdot I_{out}^2 \cdot R_{LOAD} \quad \text{Equation 2}$$

In bipolar technology amplifiers, collector current is a function of the base current, and therefore of the base-emitter voltage applied to the transistor. An example of a prior art approach [4] is depicted in FIG. 2 in which there are no extra losses and a relatively small amount of additional device area is required. This approach makes use of the relationship between output power and base-emitter voltage. The supply voltage Vcc may be constant. A sense transistor may be a bipolar transistor is formed as close as possible to the output power transistor to generate the current Isense. The sense transistor may even be a field effect transistor. A scaled replica of the DC current drawn by the power transistor is then converted to a voltage Vsense. The voltage Vsense is AC shunted to ground while a DC component is fed to the non-inventing input of the error amplifier U1.

The output of the error amplifier U1 is connected to the base terminal of the power transistor, and due to the negative feedback loop, controls the DC collector current of the bipolar power transistor. With the PA output power proportional to the DC collector current, control of the output power is actuated by varying a power control voltage Vpc. A current limited mode is then obtained by controlling the base-emitter voltage of the power transistor at a constant voltage Vcc.

A similar current sensing cell employed in a feedback bias control circuit is described in E. Jarvinenn, "Bias Circuits for GaAs HBT Power Amplifiers," 2001 *IEEE MTT-S Digest*, pp 507-510 [5]. However, in both of these approaches, the current Isense (or Im) can be assumed to represent a scaled replica of the DC current of the power bipolar junction transistor only if the sense and the power transistor have the same temperature, same base-emitter voltage and same AC load.

These conditions hardly exist in the case of an AC grounded load of the sense transistor. Therefore, mismatches will occur between the collector currents of the power and of the sense transistor due to a high harmonic content of collector voltage and current waveforms. Once the AC load termination of the power transistor has been fixed, a two-step calibration procedure will be necessary. First, output power versus collector current of the power transistor; and secondly, collector current versus the current Isense (i.e., the voltage Vsense) of the sense transistor. These mismatches limit the field of application of the circuit arrangement proposed in [4] to linear power amplifiers or to saturated amplifiers to a limited range of accuracy.

SUMMARY OF THE INVENTION

In view of the foregoing background, an object of the present invention is to significantly enhance the precision and reliability of controlling a broad dynamic power range of a high efficiency power amplifier functioning with a non-continuous conduction.

This and other objects, advantages and features in accordance with the present invention are provided by implementing a current limited mode of operation by sensing a base current of an output power transistor, and comparing it with a certain control current that is normalized by scaling it as a function of the current gain ($\beta$) of a bipolar junction transistor of similar characteristics as the output power transistor.

This advantageously provides precision and robustness of the control by effectively compensating for the fabrication process spread of current gain figures of bipolar junction transistors. Moreover, by employing a band-gap temperature compensation control current that is eventually β-scaled before comparing it with the sensed base current of the output power transistor, the output power may be effectively controlled and maintained constant over temperature as well as process spread variations.

The sense transistor of the sense network of the collector current of the output power transistor may be coupled as an emitter-follower to the base node of the output power transistor for sensing the base current of the output transistor.

A control current generator, preferably a band-gap temperature compensated current generator, may force a temperature compensation control current through a bipolar junction transistor of similar characteristics of the output power transistor, and a divider circuit by the current gain (β) of the bipolar junction transistor produces a β-scaled base current that is compared with the sensed base current of the output power transistor.

The two currents to be compared may be converted to voltage signals on respective current-to-voltage converting networks, and the corresponding voltage signals may be applied to respective input nodes of the error amplifier of the control loop. As a function of the output signal of the error amplifier, an input biasing network may maintain the DC base current of the output power transistor equal to the β-scaled control current or limits the maximum DC base current of the output power transistor to the same value.

DETAILED DESCRIPTION OF THE PREFERRED EMBODIMENTS

Figure 1:
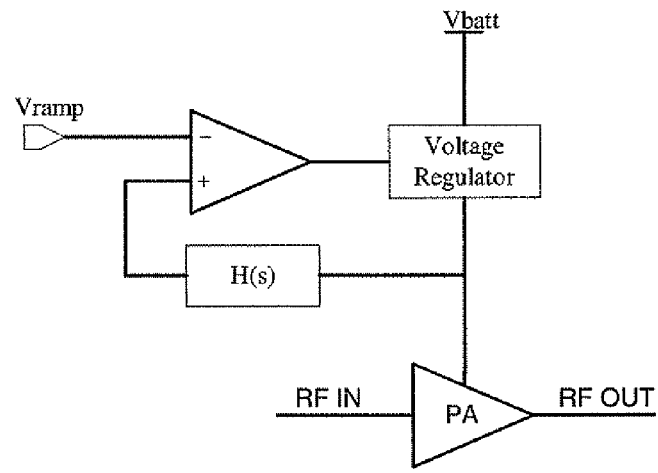
FIG. 1 is an output power control circuit according to the prior art.
Figure 2:
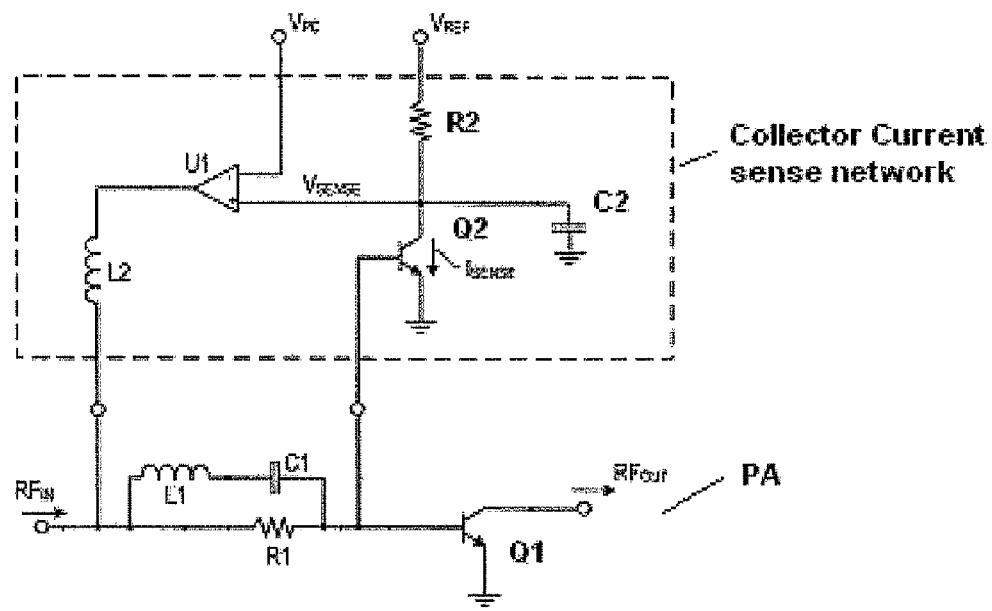
FIG. 2 is an output power control circuit with a sense transistor for monitoring the output transistor collector current according to the prior art.
Figure 3:
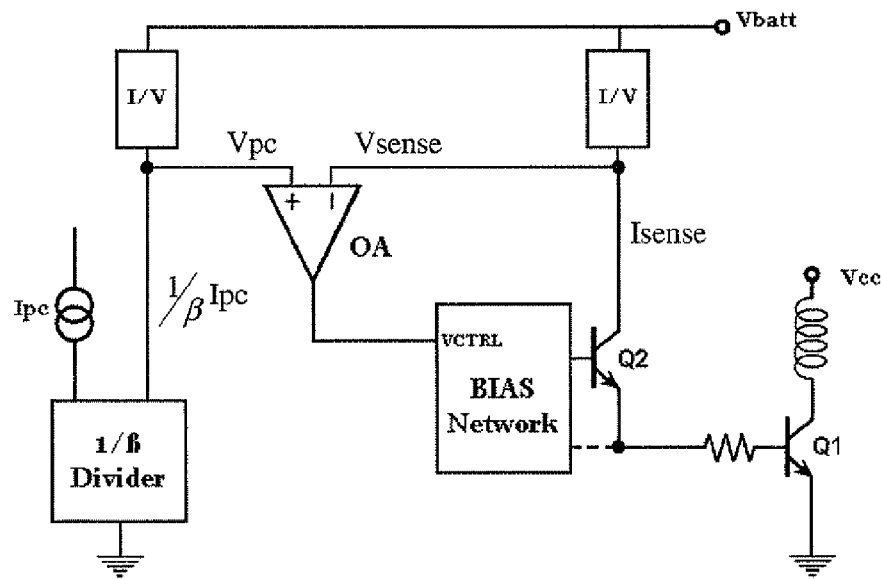
FIG. 3 is an output power control circuit according to the invention.

A basic diagram of the power control bias circuit in accordance with the invention is shown in FIG. 3. According to a fundamental aspect, the base current of the power bipolar transistor Q1 is sensed by an emitter follower sense transistor Q2.

The base current sensed by transistor Q2 is converted by an I/V block and the resulting voltage signal Vsense is compared by the error amplifier OA with a power control signal Vpc. The power control signal Vpc is produced by similarly converting a β-scaled control current 1/β Ipc. A control current generator generates a current Ipc that is then divided by the circuit block 1/β Divider by the current gain (β) of a bipolar junction transistor of the same type of the output transistor Q1 to produce a β-scaled control circuit 1/β Ipc. The error signal, output by the error amplifier OA, drives the input control signal Vctrl of a biasing network.

Depending on the arrangement of the biasing network, the negative feedback loop that closes itself through the transistor Q2, the error amplifier OA and the biasing network maintains the DC base current of the output power transistor Q1 equal to I/β Ipc or limits the maximum DC base current to the same value I/β Ipc.

Moreover, with the sensed base current of transistor Q1 being compared to a β-scaled replica of the control current Ipc, if a band-gap temperature compensated control current Ipc is used, then the collector current of the output power transistor Q1 can be controlled and maintained constant over temperature and process spread variations.

Thus, the output power of the power amplifier PA can be controlled in a current limited mode of operation by varying the control current Ipc. Once the regulation law is determined, the relationship between the output power and the base current is established with a single step calibration procedure. This may include trimming the mirroring ratio of the β-scaled replica of the control current Ipc onto the respective I/V block at the input of the error amplifier OA.

The power control circuit drastically reduces sensitivity to process spread variations of the current gain of bipolar junction transistors because the control current that is compared with the sensed base current of the output power is normalized by β-scaling it.

In high efficiency non-linear amplifiers operating under large signal conditions, the output power transistor may exhibit a substantial compression of its β caused by an enhanced effect of non-linearities under large signal conditions while the β scaling is operated by the block 1/β Divider on the control current. Therefore, a mismatch or a significant deviation from the established regulation principle should occur. However, this does not represent a real problem or drawback.

Indeed, it has been found that such a recognizable deviation of the respective β scalings of the collector current of the output power transistor that is sensed as a base current of the output transistor itself, and of the control current on which a β scaling is performed at a DC bias level, can be compensated when establishing the most appropriate regulation principle through a single circuit trimming operation. This may be performed by adjusting the mirroring ratio of the β-scaled control current onto the relative I/V network from which the reference signal of the error amplifier of the control loop is derived.

Figure 4:
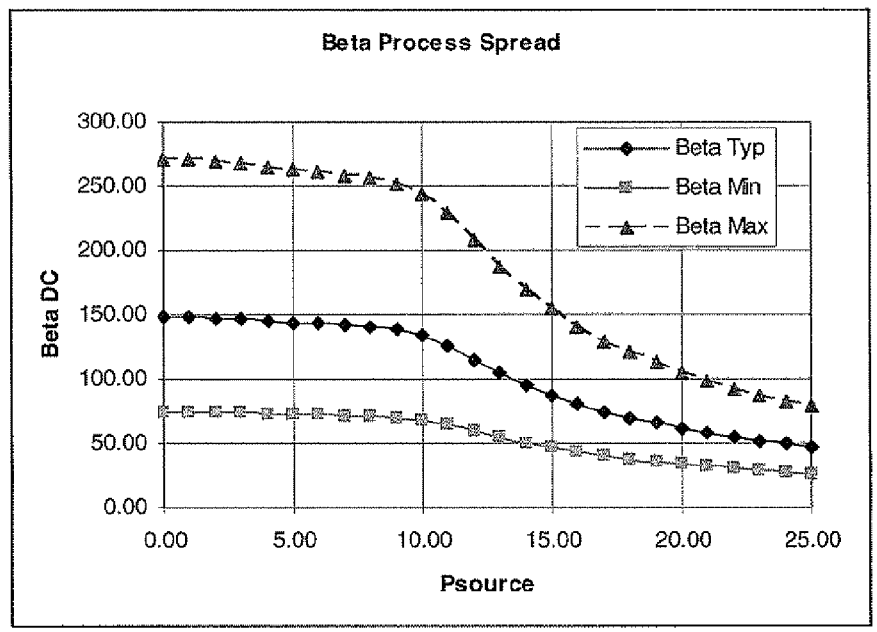
FIG. 4 is a graph showing the spread of current gain (β) versus input power without β-scaling of the control circuit according to the invention.
Figure 5:
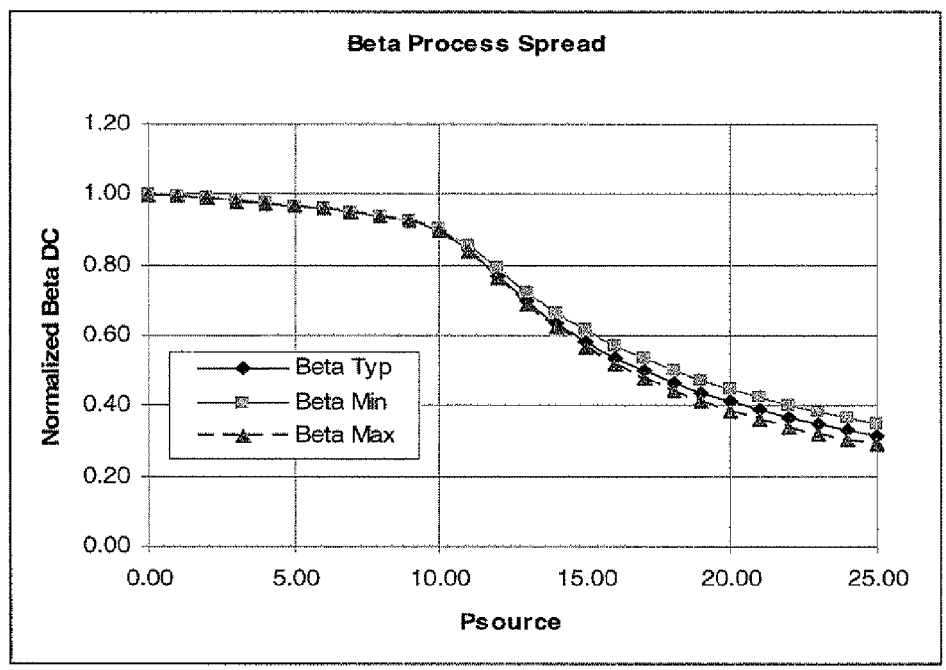
FIG. 5 is a graph showing the spread of current gain (β) versus input power with β-scaling of the control circuit according to the invention.

This can be observed from the β compression characteristics (ratio between DC collector and base current) of the bipolar output power transistor versus input signal power (Psource) over process spread variations depicted in FIGS. 4 and 5.

By normalizing each β curve by its maximum value, process spread variations have the same level of compression versus source power. Thus, comparison between a β-scaled control current 1/β Ipc and the sensed base current Isense of the output power transistor Q1 allows a high accuracy of control of the output power of the power amplifier PA versus temperature and process spread variations to be maintained.

Figure 6:
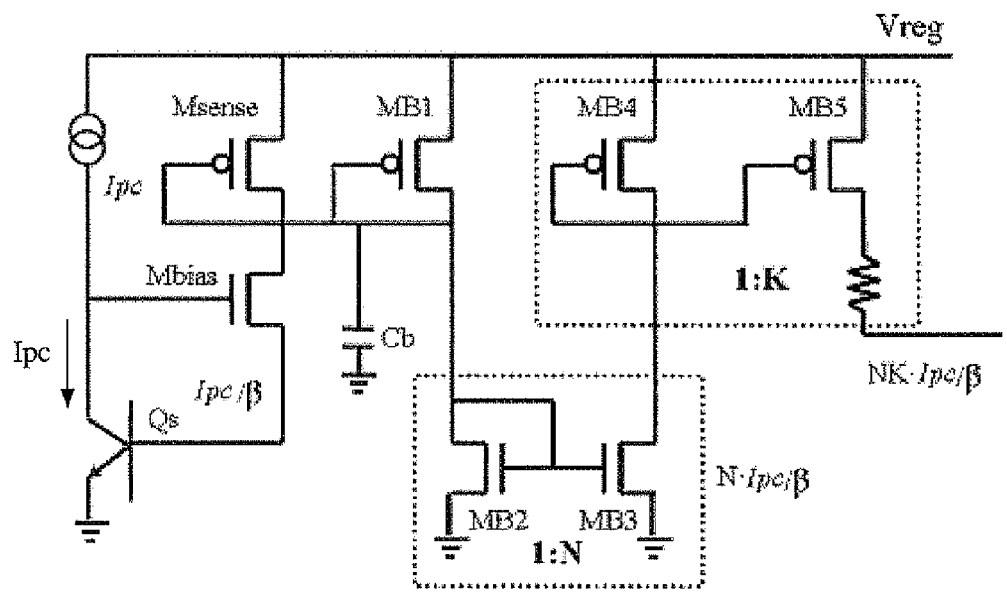
FIG. 6 is a circuit for β-scaling a certain control current according to the invention.

An example of a suitable β-Divider circuit is shown in FIG. 6. A control current $I_{Qs}$ is forced through a bipolar transistor Qs of the same type as the output power transistor and its base current is mirrored on the MOS transistor Msense. The current $I_{Qs}$ is eventually multiplied by a current mirror for providing a β-scaled replica of the Qs base current of the correct magnitude that is the β-scaled current. It is multiplied by the mirroring ratio 1/N of a first mirror MB2-MB3, and then by the mirroring ratio 1/K of a second mirror MB4-MB5 to produce a β-scaled control current $NK(I_{Qs}/β)$. Preferably, the two mirroring ratios are adjustable during testing on wafer of the devices being fabricated to trim the regulation characteristic of the control loop.

Referring back to the basic circuit of FIG. 3, Isense is equal to the collector current of the power amplifier PA output transistor Q1, and is divided by its current gain (β). This value is then compared to 1/β Ipc which is a β-scaled replica of the collector current of a bipolar transistor Qs of the same type of Q1. Once the appropriate regulation characteristic curve is determined, it will be maintained over the β process spread variations.

Figure 7:
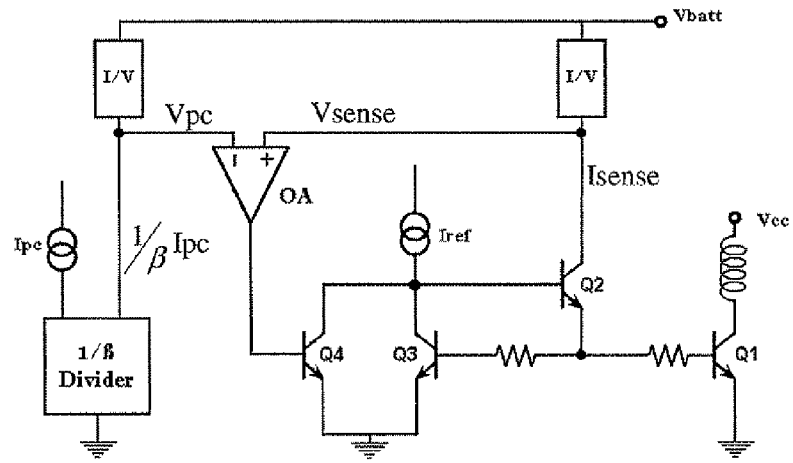
FIG. 7 is an embodiment of the control circuit according to the invention.
Figure 8:
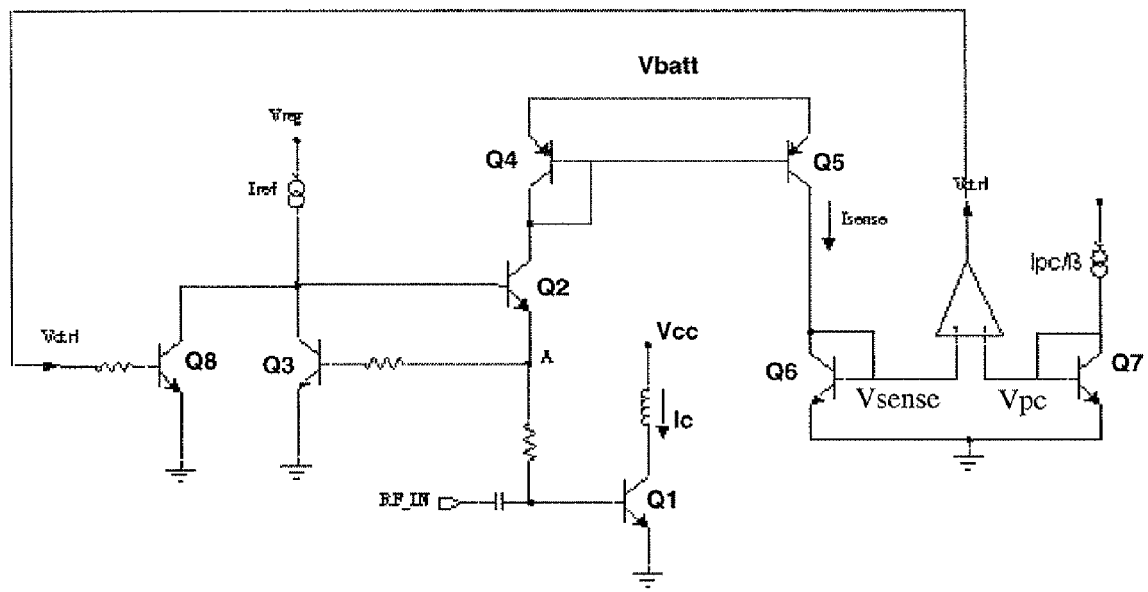
FIG. 8 is a detailed diagram of the control circuit of FIG. 7.

FIG. 7 shows an embodiment in which an open collector transistor is used to close the feedback loop between the sense transistor Q2 and the amplifier OA. In this case, if the base current of the output power transistor Q1 is lower then the β-scaled replica of the control current 1/β Ipc, transistor Q4 of the differential pair Q4-Q3 is open and the bias currents are fixed by the biasing current generator Iref. If the base current of Q1 becomes higher then 1/β Ipc, the amplifier OA of the feedback loop will reduce the base current of transistor Q1 for fixing its value to 1/β Ipc. A corresponding detailed circuit is shown in FIG. 8.

Figure 9:
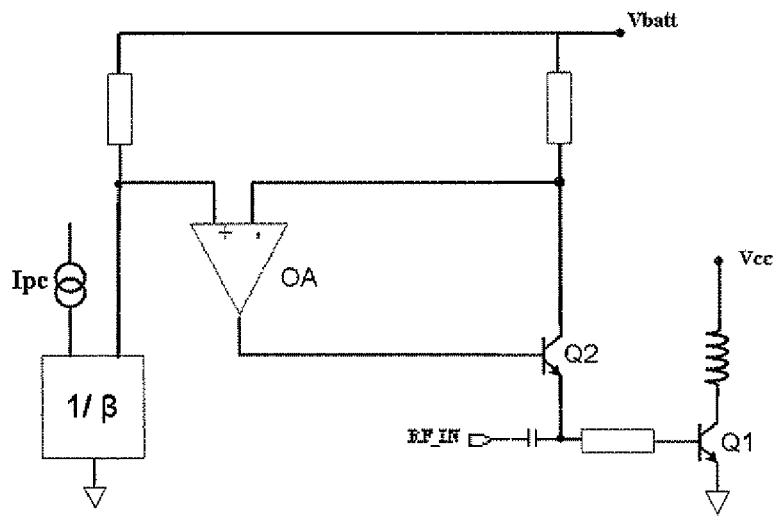
FIG. 9 is an alternative embodiment of the control circuit according to the invention.

According to an alternative embodiment of FIG. 9, the feedback loop is instead always active, and therefore, will fix or set the base current of the output power transistor Q1 to a constant value. This constant value is equal to 1/β Ipc over temperature, process spread and input power variations.

Figure 10:
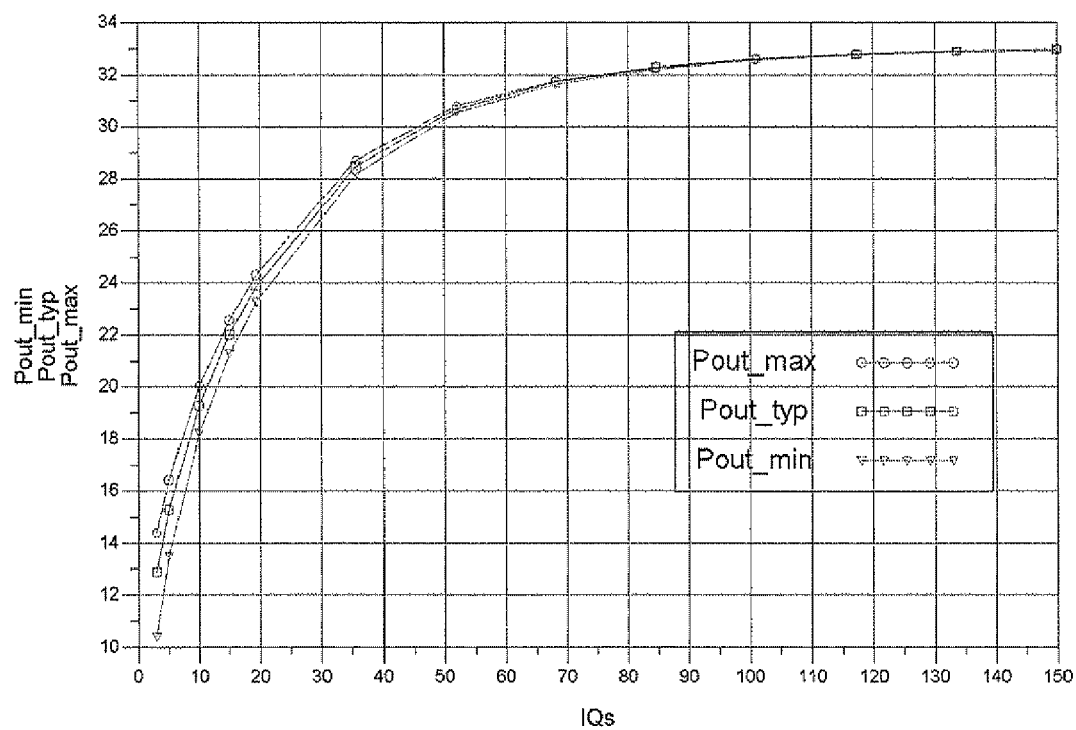
FIG. 10 is a plot showing regulation of the output power as a function of the control current input according to the invention.

An example of an output power regulation of a power amplifier PA at a constant supply voltage is reported in FIG. 10. A dynamic range of 19 dB can be achieved with ±1 dB of accuracy versus process spread and temperature variations.

REFERENCES

[1] Earl McCune, "Polar modulation and bipolar RF power devices", *BCTM Conferences* 2005.
[2] R. A. Heising, "Modulation Methods," *Proceedings of the IEEE,* May 1962, pp. 896-901.
[3] D. Epperson et al., "Power Amplifier Control Circuit," U.S. Pat. No. 6,853,250, Jul. 16, 2003.
[4] S. P. Bachhuber et al., "Amplifier Power Control Circuit," U.S. Pat. No. 6,853,250, Mar. 31, 2005.
[5] E. Jarvinenn, "Bias Circuits for GaAs HBT Power Amplifiers," 2001 *IEEE MTT-S Digest,* pp 507-510.
[6] G. Gramegna et al., "Precision low-noise current mode biasing scheme for BJT with inductive emitter degeneration," U.S. Pat. No. 6,271,695.

That which is claimed:

1. A control circuit for controlling an output current from an output bipolar power transistor comprising:
   a sense network comprising a sense transistor coupled as an emitter-follower to a base of the output bipolar power transistor for sensing a base current thereof;
   an error amplifier for comparing an input bias voltage with a power control signal for generating an output signal;
   an input biasing network being controlled by the output signal from said error amplifier for biasing the output bipolar power transistor;
   a control current generator for generating a control current;
   a current-scaling circuit coupled to said control current generator and comprising a bipolar transistor of a same type as said output bipolar power transistor, and through which the control current generated by said control current generator generates a current-scaled control current to be compared with the sensed base current of said output bipolar power transistor;
   a first current-to-voltage converting network coupled to an output of said current-scaling circuit; and
   a second current-to-voltage converting network coupled to a collector of said emitter-follower sense transistor;
   said error amplifier having a first input coupled to said first current-to-voltage converting network, and a second input coupled to said second current-to-voltage converting network.

2. The control circuit of claim 1, wherein said first and second current-to-voltage converting networks are coupled to a same voltage reference.

3. The control circuit of claim 1, wherein said input biasing network comprises a reference current generator; and a differential stage biased by said reference current generator, said differential stage comprising:
   a first transistor comprising a base being driven by the output signal from said error amplifier, and a collector; and
   a second transistor comprising a collector coupled to the collector of said first transistor and to the base of said emitter-follower sense transistor, and a base coupled to the base of the output bipolar power transistor.

4. The control circuit of claim 1, wherein the first and second inputs of said error amplifier respectively correspond to inverting and non-inverting inputs; wherein said first current-to-voltage converting network comprises a diode-configured current-to-voltage converting transistor having a base connected to the inverting input node of said error amplifier; and wherein said second current-to-voltage converting network comprises a second diode-configured transistor having a base coupled to the non-inverting input node of said error amplifier through which the current-scaled control current is forced.

5. The control circuit of claim 1, wherein said control current generator comprises a temperature compensated band-gap generator.

6. An amplifier comprising:
   an output power transistor; and
   a control circuit for controlling an output current from said output power transistor, said control circuit comprising
      a sense transistor coupled to a control terminal of said output power transistor for sensing a control terminal current thereof;
      an error amplifier for comparing an input bias voltage with a power control signal for generating an output signal;
      an input biasing network being controlled by the output signal from said error amplifier for biasing said output power transistor;
      a current-scaling circuit comprising a transistor of a same type as said output power transistor, and through which a control current generates a current-scaled control current to be compared with the sensed control terminal current of said output power transistor;
      a first current-to-voltage converting network coupled to an output of said current-scaling circuit; and
      a second current-to-voltage converting network coupled to a conduction terminal of said sense transistor;
      said error amplifier having a first input coupled to said first current-to-voltage converting network, and a second input coupled to said second current-to-voltage converting network.

7. The amplifier of claim 6, wherein said output power transistor comprises a bipolar transistor, with the control terminal corresponding to a base and the conduction terminal corresponding to a collector of the bipolar transistor.

8. The amplifier of claim 6, wherein said first and second current-to-voltage converting networks are coupled to a same voltage reference.

9. The amplifier of claim 6, wherein said input biasing network comprises a reference current generator; and a differential stage biased by said reference current generator, said differential stage comprising:
   a first transistor comprising a control terminal being driven by the output signal from said error amplifier, and a conduction terminal; and
   a second transistor comprising a collector coupled to the conduction terminal of said first transistor and to the control terminal of said sense transistor, and a control terminal coupled to the control terminal of the output power transistor.

10. The amplifier of claim 6, wherein the first and second inputs of said error amplifier respectively correspond to inverting and non-inverting inputs; wherein said first current-to-voltage converting network comprises a diode-configured current-to-voltage converting transistor having a control terminal connected to the inverting input node of said error amplifier; and wherein said second current-to-voltage converting network comprises a second diode-configured transistor having a control terminal coupled to the non-inverting input node of said error amplifier through which the current-scaled control current is forced.

11. The amplifier of claim 6, further comprising a control current generator for generating the control current, said control current generator comprising a temperature compensated band-gap generator.

12. A method for controlling an output current of an output power transistor comprising:
   sensing a control terminal current of the output power transistor using a sense transistor;
   comparing an input bias voltage with a power control signal in an error amplifier for generating an output signal;
   biasing the output power transistor based on the output signal from the error amplifier;
   generating a control current from a control current generator;
   providing a control current to a current-scaling circuit coupled to the control current generator, the current-scaling circuit comprising a transistor of a same type as the output power transistor, and through which the control current generates a current-scaled control current to be compared with the sensed control terminal current of the output power transistor;
   the error amplifier having a first input coupled to a first current-to-voltage converting network that is coupled to the current-scaling circuit, and a second input coupled to a second current-to-voltage converting network coupled to a collector of the sense transistor.

13. The method of claim 12, wherein the output power transistor comprises a bipolar transistor, with the control terminal corresponding to a base and the conduction terminal corresponding to a collector of the bipolar transistor.

14. The method of claim 12, wherein the first and second current-to-voltage converting networks are coupled to a same voltage reference.

15. The method of claim 12, wherein the input biasing network comprises a reference current generator; and a differential stage biased by the reference current generator, the differential stage comprising:
   a first transistor comprising a control terminal being driven by the output signal from the error amplifier, and a conduction terminal; and
   a second transistor comprising a collector coupled to the conduction terminal of the first transistor and to the control terminal of the sense transistor, and a control terminal coupled to the control terminal of the output power transistor.

16. The method of claim 12, wherein the first and second inputs of the error amplifier respectively correspond to inverting and non-inverting inputs; wherein the first current-to-voltage converting network comprises a diode-configured current-to-voltage converting transistor having a control terminal connected to the inverting input node of the error amplifier; and wherein the second current-to-voltage converting network comprises a second diode-configured transistor having a control terminal coupled to the non-inverting input node of the error amplifier through which the current-scaled control current is forced.

17. The method of claim 12, further comprising a control current generator for generating the control current, the control current generator comprising a temperature compensated band-gap generator.

* * * * *